United States Patent

Chen et al.

Patent Number: 6,080,662
Date of Patent: Jun. 27, 2000

[54] METHOD FOR FORMING MULTI-LEVEL CONTACTS USING A H-CONTAINING FLUOROCARBON CHEMISTRY

[75] Inventors: Bi-Ling Chen, Taipei; Erik S. Jeng, Hsinchu; Hao-Chieh Liu, Taipei, all of Taiwan

[73] Assignee: Vanguard International Semiconductor Corporation, Hsinchu, Taiwan

[21] Appl. No.: 09/186,346

[22] Filed: Nov. 4, 1998

[51] Int. Cl.[7] .................... H01L 21/4763; H01L 21/302; H01L 21/461

[52] U.S. Cl. .................... 438/637; 438/706; 438/711; 438/714; 438/724; 438/723; 438/734

[58] Field of Search .................... 438/637, 638–640, 438/668, 700–703, 706–714, 721, 723–725, 734, 769, 786

[56] References Cited

U.S. PATENT DOCUMENTS

| | | | |
|---|---|---|---|
| 5,490,901 | 2/1996 | Kim | 156/643.1 |
| 5,906,948 | 5/1999 | Liu et al. | 438/689 |
| 5,948,701 | 9/1999 | Chooi et al. | 438/694 |
| 5,990,015 | 11/1999 | Lin et al. | 438/706 |
| 5,994,228 | 11/1999 | Jeng et al. | 438/698 |
| 6,010,968 | 1/2000 | Yang et al. | 438/719 |

*Primary Examiner*—Charles Bowers
*Assistant Examiner*—Thanh Nguyen
*Attorney, Agent, or Firm*—Christensen O'Connor Johnson & Kindness PLLC

[57] ABSTRACT

A method for forming multi-level contact holes in a semiconductor structure is disclosed. The semiconductor structure includes a dielectric layer overlying a silicon substrate, a silicon nitride layer within the dielectric layer, the silicon nitride layer overlying a first conductive layer, a silicon oxynitride layer within the dielectric layer, the silicon oxynitride layer overlying a second conductive layer, and a plate poly layer. The method comprises: using a first etching step to etch through the dielectric layer to reach the silicon nitride layer as well as reach the silicon oxynitride layer, the first etching step using a combination of a first gas mixture and a first gas, the first gas mixture comprising a combination of $N_2$, CO and Ar. The first gas includes $C_4F_8$, $CH_3F$ and $O_2$, the flow rate ratio of the first gas $C_4F_8/CH_3F/O_2$ is about 6:1:3. The flow rate of each component of the first gas mixture is that, the flow rate of $N_2$ is about 0–20 sccm, the flow rate of CO is about 0–200 sccm, and the flow rate of Ar is about 100–600 sccm. In addition, the flow rate of each component of the first gas is that, the flow rate of $C_4F_8$ is about 8–40 sccm, the flow rate of $CH_3F$ is about 1–7 sccm, and the flow rate of $O_2$ is about 0–20 sccm. Then using a second etching step to etch through the silicon nitride layer to reach the first conductive layer, the second etching step also etching through the silicon oxynitride layer to reach the second conductive layer. The second etching step uses a combination of the first gas mixture and a second gas, the second gas comprising $CH_3F$ of the flow rate of about 3–14 sccm.

19 Claims, 3 Drawing Sheets

METHOD FOR FORMING MULTI-LEVEL CONTACTS USING A H-CONTAINING FLUOROCARBON CHEMISTRY

TECHNICAL FIELD OF THE INVENTION

This invention relates to a method for forming multi-level contacts, and more particularly, to a method for forming multi-level contacts in large scale semiconductor devices.

BACKGROUND OF THE INVENTION

The manufacture of a DRAM memory cell includes the fabrication of a transistor, a capacitor and contacts to periphery circuits. To shrink the area of the devices in the DRAM cell is one of the most important issues for the designer of DRAM memory. With the advent of ULSI DRAM devices, the size of the memory cells becomes smaller and smaller such that the area available for a single memory cell has become exceedingly small.

Additionally, because the step height of a stacked capacitor is too large for large-scale semiconductor devices, a multi-level contact for the periphery circuit is widely used. Further, the self aligned contact must be used in ULSI products. However, when there is no need to use self aligned contact technology, the spacer and the cap of the gate electrode can be formed of TEOS oxide.

Referring to FIG. 1, a plurality of multi-level contact holes are formed. A silicon substrate 9 provides the base for the semiconductor devices. A plate poly layer 10 is connected to a capacitor 11 of the semiconductor device, and a bit line 13 includes a first tungsten silicide layer 13a and a first polysilicon layer 13b. The word line 17 includes an oxide cap 17a, an oxide spacer 17b, a second tungsten silicide layer 17c, and a second polysilicon layer 17d. The bit line 13 and the word line 17 are used to address the memory cell. A plurality of multi-level contact holes 18 are formed by penetrating a BPSG layer 19 using the developed photoresist layer 20 as a mask. Because the integration of the semiconductor device mentioned above is not high, it is unnecessary to utilize a self aligned contact and an antireflection layer. Thus, the multi-level contact holes can be formed in an etching step using fluorine containing gas as a etchant.

When a large scale integration product is to be fabricated, an anti-reflection layer must be used to increase the cell density and improve the photo proximity effect. The inorganic anti-reflection layer is typically composed of silicon nitride ($Si_3N_4$) or silicon oxynitride (SiON). In addition, self aligned contact technology is used to increase critical dimension control. Thus, the material used to form the spacer and the cap of the gate electrode is changed to silicon nitride ($Si_3N_4$).

Turning to FIG. 2, a silicon substrate 29 provides a base for the large scale semiconductor devices. A plate poly layer 30 is connected to a capacitor 31 of the large scale semiconductor device, and the bit line 33 includes a first tungsten silicide layer 33a, a first poly silicon layer 33b, and a silicon oxynitride layer 33c. The silicon oxynitride layer 33c, which can also be a Si3N4 layer on the first tungsten silicide layer 33a is used as an anti-reflection layer or an etching hardmask. The word line 37 includes a silicon nitride layer 37a, a silicon nitride spacer 37b, a second tungsten silicide layer 37c, and a second polysilicon layer 37d. The bit line 33 and the word line 37 are used to address the semiconductor device. Subsequently, to form the multi-level contact, a photoresist layer 38 is developed on the BPSG layer 39.

When a traditional etching process 40 is used to form the multi-level contact holes 41, the etching process 40 tends to result in etch-stop/polymer regrowth on the silicon nitride layer 37a and the silicon oxynitride layer 33c. Thus, contact is not made to the underlying conductive layers. Further, the photoresist selectivity is poor. As shown in FIG. 3, the tungsten silicide layer 33a and the second tungsten silicide layer 37c are not exposed. Further, the etching tends to over etch the plate poly layer 30 and the silicon substrate 29 when a traditional etching process 40 such as $CF_4$ or $C_4H_8+CO$ is used.

What is needed is a new etching process that will etch through the silicon nitride layers and silicon oxynitride layers without poor photoresist loss for controlling the critical dimension of the semiconductor process.

SUMMARY OF THE INVENTION

A method for forming a plurality of contact holes in a semiconductor structure is disclosed. The semiconductor structure includes a dielectric layer overlying a silicon substrate, a silicon nitride layer within said dielectric layer, said silicon nitride layer overlying a first conductive layer, a silicon oxynitride layer within said dielectric layer, said silicon oxynitride layer overlying a second conductive layer, and a plate poly layer. The method comprises: using a first etching step to etch through said dielectric layer to reach said silicon nitride layer as well as reach said silicon oxynitride layer. The first etching step uses a combination of a first gas mixture and a first gas. The first gas mixture includes a combination of $N_2$, CO, and Ar that are approximately of the flow rate 0–20, 0–200, and 100–600 sccm, respectively. The flow rate ratio of the first gas $C_4F_8/CH_3F/O_2$ is about 6:1:3, in addition, the flow rate of the the first gas $C_4F_8/CH_3F/O_2$ is about 8–40, 1–7, and 0–20 sccm respectively. Then use a second etching step to etch through said silicon nitride layer to reach said first conductive layer, said second etching step also etching through said silicon oxynitride layer to reach said second conductive layer, said second etching step using a combination of said first gas mixture and a second gas, the flow rate ratio of said second gas $C_4F_8/CH_3F/O_2$ is about 6:2:3.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

The two-step etching process of the present invention produces a polymer on the surface of polysilicon when etching the polysilicon. Also, the etching process can etch through the silicon nitride layer 37a and the silicon oxynitride layer 33c without polymer regrowth.

Figure 1:
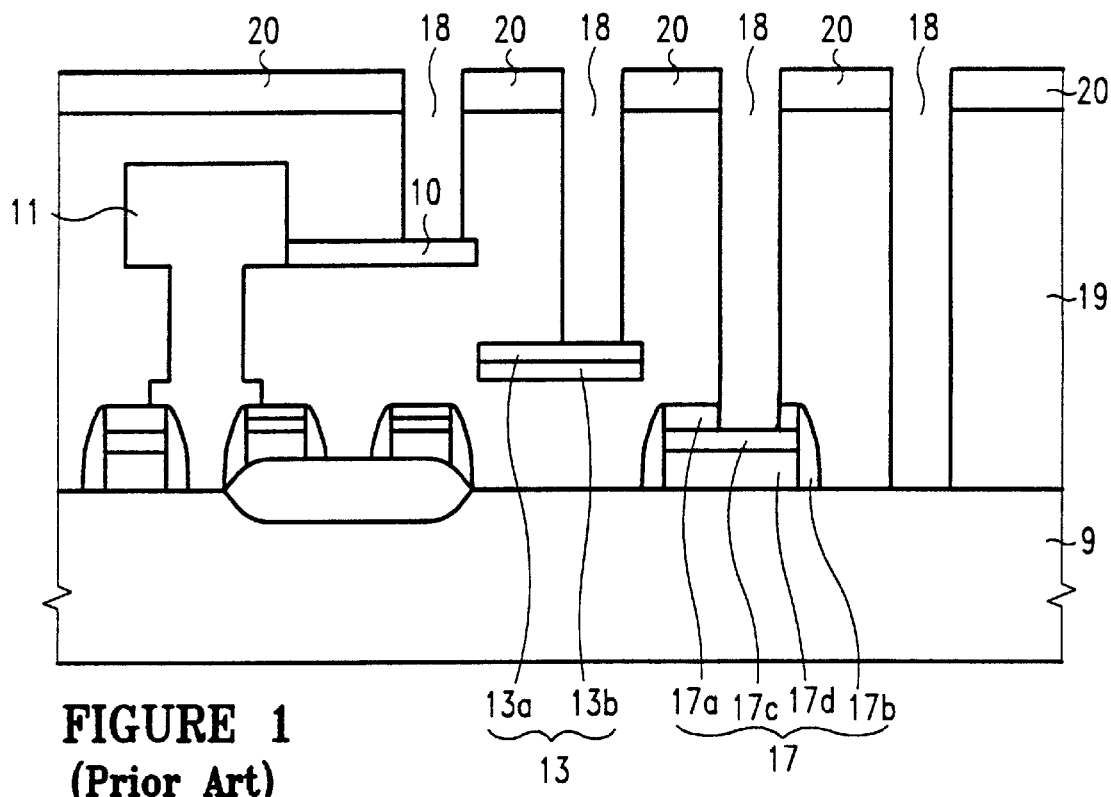
FIG. 1 illustrates a cross sectional view of a prior art semiconductor device without Si3N4 cap on the word line.
Figure 2:
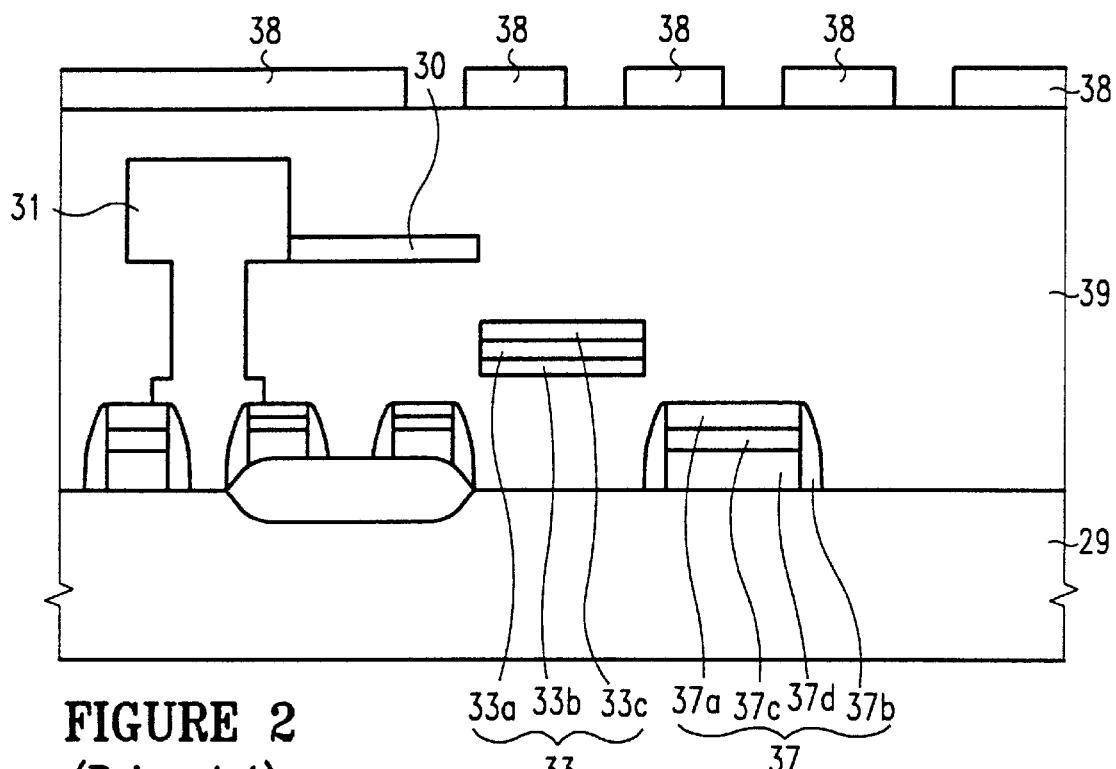
FIG. 2 illustrates the cross sectional view of a prior art large scale semiconductor device with Si3N4 cap on word line.
Figure 3:
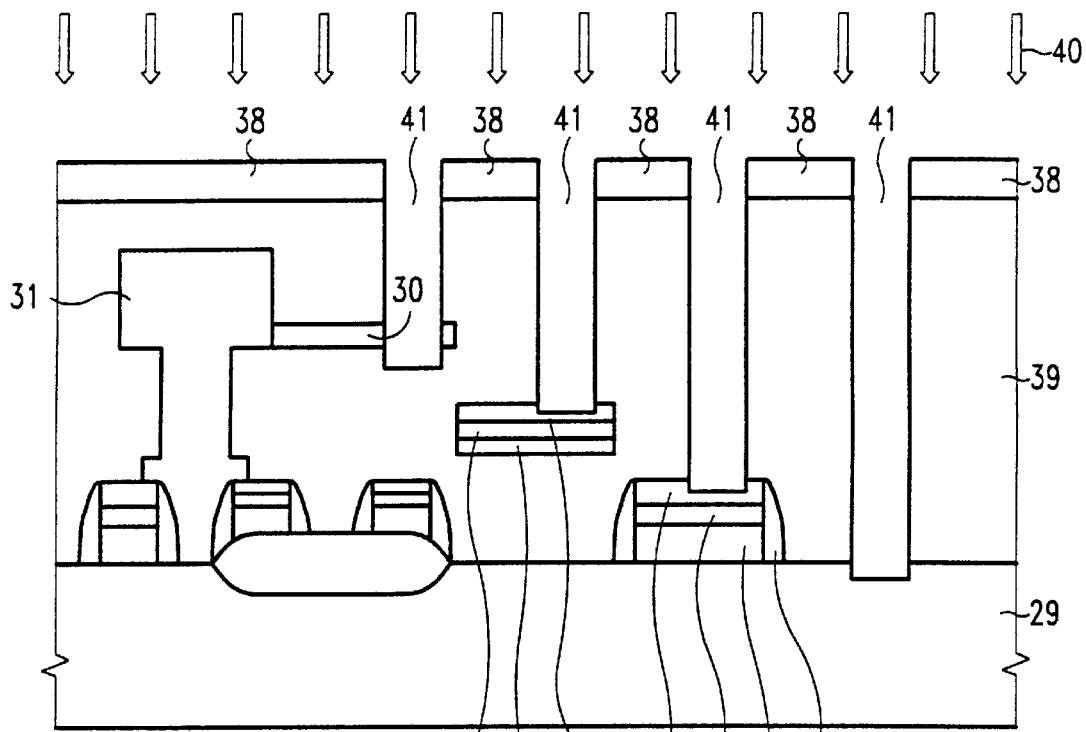
FIG. 3 illustrates the cross sectional view of a prior art large scale semiconductor device using self aligned contact technology with multi-level contact holes.
Figure 4:
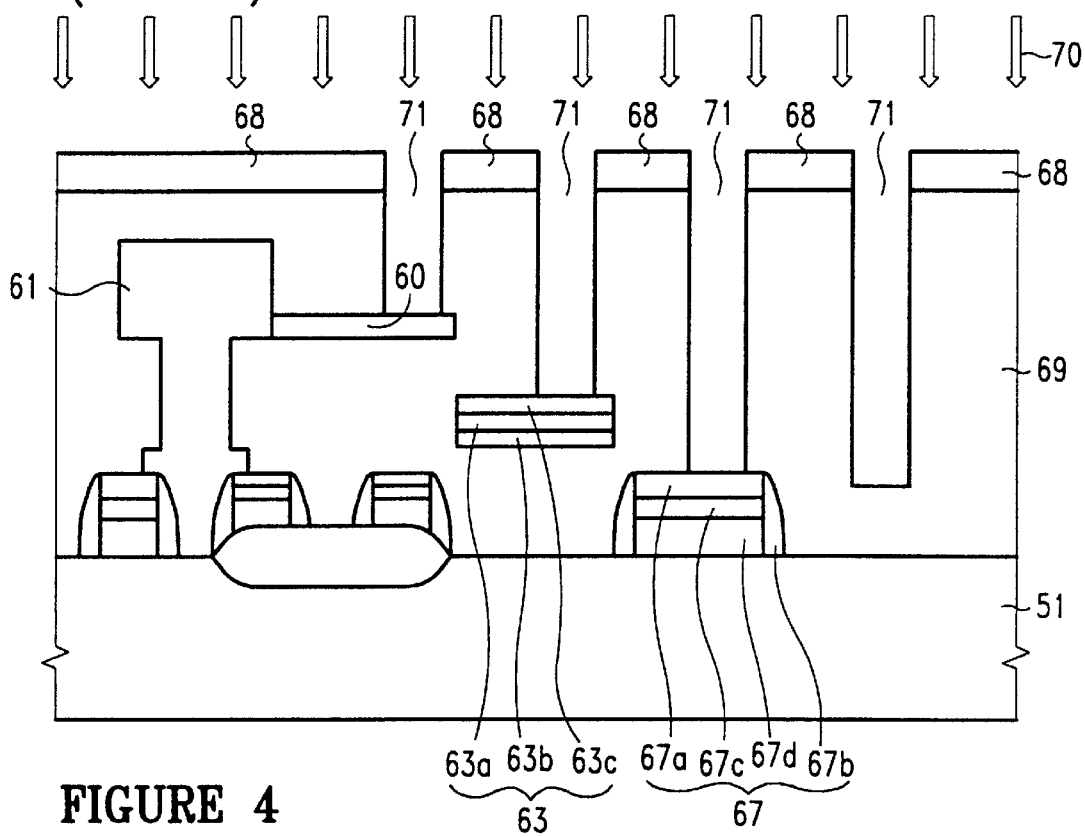
FIGS. 4–5 illustrates cross sectional views of a large scale semiconductor device using a two step etching process according to the preferred embodiment of the present invention.

Referring to FIG. 4, a silicon substrate 51 is provided as a base for the semiconductor devices. A plate poly layer 60 is connected to a capacitor 61. A bit line 63 includes a first conductive layer 63a, a first polysilicon layer 63b, and a silicon oxynitride layer 63c. The first conductive layer 63a in the preferred embodiment is formed of tungsten silicide. The silicon oxynitride layer 63c, which can also be formed of silicon nitride ($Si_3N_4$) on the first conductive layer 63a is used as an anti-reflection layer.

A word line 67 includes a silicon nitride layer 67a, a nitride spacer 67b, a second conductive layer 67c, and a second polysilicon layer 67d. The second conductive layer in the preferred embodiment is formed of tungsten silicide. In addition, the first conductive layer 63a and second conductive layer 67c can be chosen from the group consisting of: WSi, TiSi, and CoSi. The bit line 63 and the word line 67 are used to address the semiconductor device (typically a DRAM memory cell).

Next, a photoresist layer 68 is developed on the dielectric layer 69. The dielectric layer 69 is preferably formed of BPSG. Then, according to the preferred embodiment of the present invention, a first etching process 70 is performed. The first etching process 70 uses a plasma chemistry of $C_4F_8$, $CH_3F$, $O_2$, $N_2$, CO, and Ar that are of the flow rate 8–40, 1–7, 0–20, 0–20, 0–200, and 100–600 sccm, respectively. The flow rate ratio of $C_4F_8/CH_3F/O_2$ during the first etching step is about 6:1:3. Preferably, the power used in the first etching process is about 1000–2000 Watts. This etching process 70 exhibits a good selectivity ratio between the photoresist layer 68 and dielectric layer 69. Because the first etching process 70 has a high selectivity ratio between the photoresist layer 68 to the dielectric layer 69, the removal of the photoresist layer 68 during the first etching process 70 is minimal. The selectivity ratio from the photoresist layer 68 to the dielectric layer 69 during the first etching process 70 is about 8–9. Further, it has been found that the first etching process 70 stops at the surface of the silicon oxynitride layer 63c and the silicon nitride layer 67a.

Figure 5:
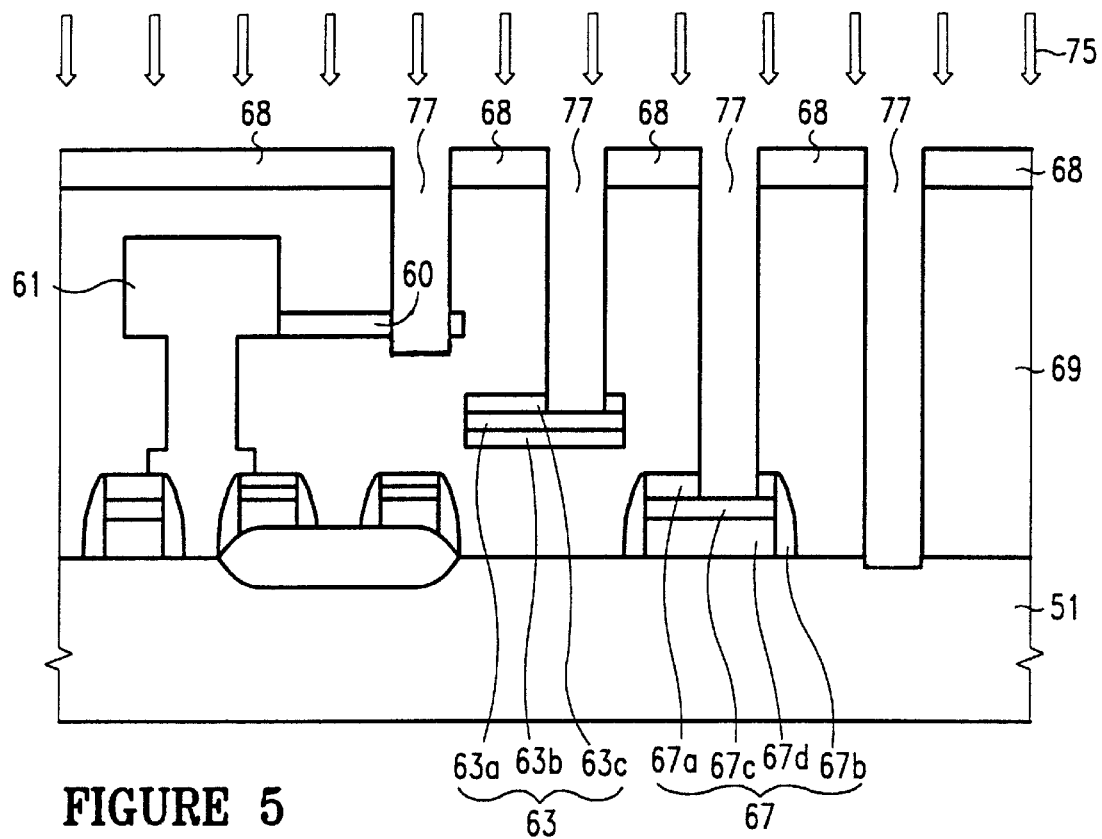

After the first etching, referring to FIG. 5, a second etching process 75 is performed to further etch the multilevel contact holes 77. The second etching process 75 uses the same plasma as the first etching process 70 except that the second etching process 75 uses a $CH_3F$ concentration different from that in the first etching step 70. The flow rate ratio of $C_4F_8/CH_3F/O_2$ is about 6:2:3. The flow rate of the $CH_3F$ used in the second etching process 75 is about 3–14 sccm. Preferably, the power used in the etching process is about 1000–2000 Watts. The second etching process 75 according to the preferred embodiment of the present invention can prevent the etch stop on the silicon oxynitride layer 63c as well as the silicon nitride layer 67a. The selectivity ratio from the photoresist layer 68 to the dielectric layer 69 during the second etching process 75 is approximately more than 15, which is the important advantage of the present invention.

The second etching process 75 can penetrate the silicon nitride layer 67a and the silicon oxynitride layer 63c to expose the first conductive layer 63a and the second conductive layer 67c.

It should be noted that the use of high H-containing fluorocarbon chemistry such as $CH_3F$ in a two-step etching process is not known in the prior art.

Although specific embodiments have been illustrated and described it will be obvious to those skilled in the art that various modification may be made without departing from the spirit which is intended to be limited solely by the appended claims.

What is claimed is:

1. A method for forming a plurality of contact holes in a semiconductor structure, said semiconductor structure comprising a dielectric layer overlying a silicon substrate, a silicon nitride layer within said dielectric layer, said silicon nitride layer overlying a first conductive layer, and a silicon oxynitride layer within said dielectric layer, said silicon oxynitride layer overlying a second conductive layer, said method comprising:

developing a photoresist layer on said dielectric layer;

using a first etching step to etch through said dielectric layer to reach said silicon nitride layer as well as reach said silicon oxynitride layer, said first etching step using a combination of a first gas mixture and a first gas, said first gas mixture comprising a combination of $N_2$, CO and Ar, said first gas comprising $C_4F_8$, $CH_3F$ and $O_2$, a flow rate ratio of the first gas $C_4F_8/CH_3F/O_2$ is about 6:1:3; and using a second etching step to etch through said silicon nitride layer to reach said first conductive layer, said second etching step also etching through said silicon oxynitride layer to reach said second conductive layer, said second etching step using a combination of said first gas mixture and a second gas, said second gas comprising a combination of $C_4F_8$, $CH_3F$ and $O_2$, a flow rate ratio of said second gas $C_4F_8/CH_3F/O_2$ is about 6:2:3.

2. The method as claim 1, wherein said first conductive layer and said second conductive layer are formed of a silicide.

3. The method as claim 2, wherein said silicide is tungsten silicide.

4. The method as claim 1, wherein the flow rate of each component of the first gas mixture is that, the flow rate of said $N_2$ is about 0–20 sccm, the flow rate of said CO is about 0–200 sccm, and the flow rate of said Ar is about 100–600 sccm.

5. The method as claim 1, wherein the flow rate of each component of the first gas is that, the flow rate of said $C_4F_8$ is about 8–40 sccm, the flow rate of said $CH_3F$ is about 1–7 sccm, the flow rate of said $O_2$ is about 0–20 sccm.

6. The method as claim 1, wherein said first etching step is processed by a source power in a range of about 1000–2000 Watts.

7. The method as claim 1, wherein the flow rate of each component of the second gas is that, the flow rate of said $C_4F_8$ is about 8–40 sccm, the flow rate of said $CH_3F$ is about 3–14 sccm, the flow rate of said $O_2$ is about 0–20 p3587 sccm.

8. A method for forming a plurality of contact holes in a semiconductor structure, said semiconductor structure comprising a dielectric layer overlying a silicon substrate, a silicon nitride layer within said dielectric layer, said silicon nitride layer overlying a first conductive layer, a silicon oxynitride layer within said dielectric layer, said silicon oxynitride layer overlying a second conductive layer, and a plate poly layer, said method comprising:

using a first etching step to etch through said dielectric layer to reach said silicon nitride layer as well as reach said silicon oxynitride layer, said first etching step using a combination of a first gas mixture and a first gas, said first gas mixture comprising a combination of $N_2$, CO and Ar, said first gas comprising $C_4F_8$, $CH_3F$ and $O_2$, a flow rate ratio of the first gas $C_4F_8/CH_3F/O_2$ is about 6:1:3; and using a second etching step to etch through said silicon nitride layer to reach said first conductive layer, said second etching step also etching through said silicon oxynitride layer to reach said second conductive layer, said second etching step using a combination of said first gas mixture and a second gas, said second gas comprising a combination of $C_4F_8$, $CH_3F$ and $O_2$, a flow rate ratio of said second gas $C_4F_8/CH_3F/O_2$ is about 6:2:3.

9. The method as claim 6, wherein said first conductive layer and said second conductive layer are formed of a silicide.

10. The method as claim 7, wherein said silicide is tungsten silicide.

11. The method as claim 7, wherein the flow rate of each component of the first gas mixture is that, the flow rate of said $N_2$ is about 0–20 sccm, the flow rate of said CO is about 0–200 sccm, and the flow rate of said Ar is about 100–600 sccm.

12. The method as claim 7, wherein the flow rate of each component of the first gas is that, the flow rate of said $C_4F_8$ is about 8–40 sccm, the flow rate of said $CH_3F$ is about 1–7 sccm, the flow rate of said $O_2$ is about 0–20 sccm.

13. The method as claim 7, wherein said first etching step is processed by a source power in a range of about 1000–2000 Watts.

14. The method as claim 7, wherein the flow rate of each component of the second gas is that, the flow rate of said $C_4F_8$ is about 8–40 sccm, the flow rate of said $CH_3F$ is about 3–14 sccm, the flow rate of said $O_2$ is about 0–20 sccm.

15. A method for forming a plurality of contact holes in a semiconductor structure, said semiconductor structure comprising a dielectric layer overlying a silicon substrate, a silicon nitride layer within said dielectric layer, said silicon nitride layer overlying a first conductive layer, a silicon oxynitride layer within said dielectric layer, said silicon oxynitride layer overlying a second conductive layer, and a plate poly layer, said method comprising:

using a first etching step to etch through said dielectric layer to reach said silicon nitride layer as well as reach said silicon oxynit layer, said first etching step using a combination of a first gas mixture and a first gas, said first gas mixture comprising a combination of $N_2$, CO and Ar, said first gas comprising $C_4F_8$, $CH_3F$ and $O_2$, a flow rate ratio of the first gas $C_4F_8/CH_3F/O_2$ is about 6:1:3, a flow rate of each component of the first gas mixture being that, the flow rate of said $N_2$ being about 0–20 sccm, the flow rate of said CO being about 0–200 sccm, and the flow rate of said Ar being about 100–600 sccm, the flow rate of each component of the first gas being that, the flow rate of said $C_4F_8$ being about 8–40 sccm, the flow rate of said $CH_3F$ being about 1–7 sccm, the flow rate of said $O_2$ being about 0–20 sccm; and using a second etching step to etch through said silicon nitride layer to reach said first conductive layer, said second etching step also etching through said silicon oxynitride layer to reach said second conductive layer, said second etching step using a combination of said first gas mixture and a second gas, said second gas comprising a combination of $C_4F_8$, $CH_3F$ and $O_2$, a flow rate ratio of said second gas $C_4F_8/CH_3F/O_2$ is about 6:2:3.

16. The method as claim 15, wherein said first conductive layer and said second conductive layer are formed of a silicide.

17. The method as claim 16, wherein said silicide is tungsten silicide.

18. The method as claim 15, wherein said first etching step is processed by a source power in a range of about 1000–2000 Watts.

19. The method as claim 15, wherein the flow rate of each component of the second gas is that, the flow rate of said $C_4F_8$ is about 8–40 sccm, the flow rate of said $CH_3F$ is about 3–14 sccm, the flow rate of said $O_2$ is about 0–20 sccm.

* * * * *

UNITED STATES PATENT AND TRADEMARK OFFICE
CERTIFICATE OF CORRECTION

PATENT NO. : 6,080,662
DATED : June 27, 2000
INVENTOR(S) : B.-L. Chen et al.

It is certified that error appears in the above-identified patent and that said Letters Patent is hereby corrected as shown below:

| COLUMN | LINE | |
|---|---|---|
| 4 (Claim 2, | 28 line 1) | "as" should read "of" |
| 4 (Claim 3, | 31 line 1) | "as" should read "of" |
| 4 (Claim 4, | 33 line 1) | "as" should read "of" |
| 4 (Claim 5, | 38 line 1) | "as" should read "of" |
| 4 (Claim 6, | 42 line 1) | "as" should read "of" |
| 4 (Claim 7, | 45 line 1) | "as" should read "of" |
| 5 (Claim 9, | 8 line 1) | "as" should read "of" |
| 5 (Claim 10, | 11 line 1) | "as" should read "of" |
| 5 (Claim 11, | 13 line 1) | "as" should read "of" |
| 5 (Claim 12, | 18 line 1) | "as" should read "of" |

UNITED STATES PATENT AND TRADEMARK OFFICE
CERTIFICATE OF CORRECTION

PATENT NO. : 6,080,662
DATED : June 27, 2000
INVENTOR(S) : B.-L. Chen et al.

It is certified that error appears in the above-identified patent and that said Letters Patent is hereby corrected as shown below:

| COLUMN | LINE | |
|---|---|---|
| 5 (Claim 14, | 25 line 1) | "as" should read "of" |
| 6 (Claim 15, | 1 line 11) | "oxynit" should read --oxynitride-- |
| 6 (Claim 16, | 23 line 1) | "as" should read "of" |
| 6 (Claim 17, | 26 line 1) | "as" should read "of" |
| 6 (Claim 18, | 28 line 1) | "as" should read "of" |
| 6 (Claim 19, | 31 line 1) | "as" should read "of" |
| 5 (claim13, | 22 line 1) | "as should read "of" |

Signed and Sealed this

Eighth Day of May, 2001

Attest:

NICHOLAS P. GODICI

Attesting Officer

Acting Director of the United States Patent and Trademark Office